(12) United States Patent
Zhang et al.

(10) Patent No.: US 10,141,409 B2
(45) Date of Patent: Nov. 27, 2018

(54) THIN FILM TRANSISTOR AND ARRAY SUBSTRATE THEREOF EACH HAVING DOPED OXIDIZED OR DOPED GRAPHENE ACTIVE REGION AND OXIDIZED GRAPHENE GATE INSULATING LAYER AND PRODUCING METHOD THEREOF

(71) Applicant: BOE TECHNOLOGY GROUP CO., LTD., Beijing (CN)

(72) Inventors: Dacheng Zhang, Beijing (CN); Dianjie Hou, Beijing (CN); Wenchu Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/507,878

(22) PCT Filed: Mar. 24, 2016

(86) PCT No.: PCT/CN2016/077190
§ 371 (c)(1),
(2) Date: Mar. 1, 2017

(87) PCT Pub. No.: WO2017/049887
PCT Pub. Date: Mar. 30, 2017

(65) Prior Publication Data
US 2017/0294516 A1    Oct. 12, 2017

(30) Foreign Application Priority Data

Sep. 21, 2015  (CN) .......................... 2015 1 0604545

(51) Int. Cl.
*H01L 29/16* (2006.01)
*H01L 29/66* (2006.01)
(Continued)

(52) U.S. Cl.
CPC ........ *H01L 29/1606* (2013.01); *H01L 21/041* (2013.01); *H01L 21/28* (2013.01);
(Continued)

(58) Field of Classification Search
CPC ........... H01L 29/1606; H01L 29/66742; H01L 29/78684; H01L 27/1222; H01L 29/51; H01L 29/4908; H01L 29/45
See application file for complete search history.

(56) References Cited

U.S. PATENT DOCUMENTS 9,165,946 B1 * 10/2015 Chang ............... G02F 1/134363
2011/0057168 A1    3/2011 Kobayashi
(Continued)

FOREIGN PATENT DOCUMENTS

CN      102629579 A    8/2012
CN      102655146 A    9/2012
(Continued)

OTHER PUBLICATIONS

Search Report and Written Opinion dated Jun. 29, 2016 from State Intellectual Property Office of the P.R. China.
(Continued)

*Primary Examiner* — Michael Jung
(74) *Attorney, Agent, or Firm* — Dilworth & Barrese, LLP.; Michael J. Musella, Esq.

(57) ABSTRACT

A thin film transistor and a producing method thereof, and an array substrate, which belong to a technical field of the thin film transistor, can solve a problem of poor performance of a conventional thin film transistor. The producing method of the thin film transistor comprises: S1: forming a gate electrode (11) composed of graphene; S2: forming a gate insulating layer (12) composed of oxidized graphene; S3: forming an active region (13) composed of doped oxidized graphene or doped graphene; S4: forming a source electrode
(Continued)

(14) and a drain electrode (15) composed of graphene, wherein, the graphene composing the source electrode (14), the drain electrode (15) and the gate electrode (11) is formed by reducing oxidized graphene, and the doped oxidized graphene or doped graphene composing the active region (13) is formed by treating oxidized graphene.

17 Claims, 4 Drawing Sheets

(51) Int. Cl.
  *H01L 21/28*  (2006.01)
  *H01L 21/34*  (2006.01)
  *H01L 21/44*  (2006.01)
  *H01L 29/49*  (2006.01)
  *H01L 29/51*  (2006.01)
  *H01L 29/786*  (2006.01)
  *H01L 27/12*  (2006.01)
  *H01L 29/45*  (2006.01)
  *H01L 21/04*  (2006.01)
  *H01L 29/778*  (2006.01)

(52) U.S. Cl.
  CPC ............ *H01L 21/34* (2013.01); *H01L 21/44* (2013.01); *H01L 27/12* (2013.01); *H01L 27/1222* (2013.01); *H01L 29/45* (2013.01); *H01L 29/49* (2013.01); *H01L 29/4908* (2013.01); *H01L 29/51* (2013.01); *H01L 29/66015* (2013.01); *H01L 29/66045* (2013.01); *H01L 29/66742* (2013.01); *H01L 29/778* (2013.01); *H01L 29/786* (2013.01); *H01L 29/78684* (2013.01)

(56) References Cited

U.S. PATENT DOCUMENTS

| | | | |
|---|---|---|---|
| 2012/0049160 A1* | 3/2012 | Sano | H01L 21/8213 257/27 |
| 2014/0021446 A1* | 1/2014 | Lee | H01L 29/4908 257/29 |
| 2014/0070220 A1 | 3/2014 | Zhang et al. | |
| 2014/0239256 A1 | 8/2014 | Kim et al. | |
| 2014/0239257 A1* | 8/2014 | Moon | H01L 29/78684 257/29 |
| 2014/0284718 A1* | 9/2014 | Lim | C01B 31/043 257/347 |
| 2014/0291733 A1* | 10/2014 | Lee | G01L 1/20 257/254 |
| 2016/0126317 A1* | 5/2016 | Kim | H01L 29/1606 257/29 |

FOREIGN PATENT DOCUMENTS

| | | |
|---|---|---|
| CN | 103107068 A | 5/2013 |
| CN | 105304495 A | 2/2016 |
| WO | 2013168645 A1 | 11/2013 |

OTHER PUBLICATIONS

Chinese Office Action dated Nov. 14, 2017.
Seoung-Ki Lee, et al., All Graphene-Based Thin Film Transistors on Flexible Plastic Substrates, School of Advanced Materials Science and Engineering, ACS Publications, pp. 3472-3476, Department of Chemistry, Seoul National University, Seoul, Korea.
Koichi Suganuma et al., Fabrication of Transparent and Flexible Organic Field Effect Transistors with Solution-Processed Graphene Source-Drain and Gate Electrodes, Appl. Phys. Express 4 021603, pp. 021603-1 to 021603-3, The Japanese Society of Applied Physics, Tokyo Japan.

* cited by examiner

THIN FILM TRANSISTOR AND ARRAY SUBSTRATE THEREOF EACH HAVING DOPED OXIDIZED OR DOPED GRAPHENE ACTIVE REGION AND OXIDIZED GRAPHENE GATE INSULATING LAYER AND PRODUCING METHOD THEREOF

TECHNICAL FIELD

The present disclosure relates to a technical field of a thin film transistor, and more particularly, relates to a thin film transistor and a producing method thereof, and an array substrate.

BACKGROUND

Among a variety of display devices (such as a liquid crystal display device, an organic light emitting diode display device), the array substrate is an important component, and the array substrate comprises a large number of thin film transistors, and thus performance of the thin film transistor has significant effect on performance of the array substrate. However, performance of an existing metal oxide thin film transistor and a polycrystalline silicon thin film transistor still cannot meet the requirements.

SUMMARY

One of the objects of the present disclosure is to provide a thin film transistor having an excellent overall performance and a producing method thereof, and an array substrate comprising the thin film transistor, so as to solve the problem of poor performance of a conventional thin film transistor.

A technical solution for achieving the above-described object is a producing method of a thin film transistor, comprising steps of: forming a gate electrode composed of graphene; forming a gate insulating layer composed of oxidized graphene; forming an active region composed of doped oxidized graphene or doped graphene; forming a source electrode and a drain electrode composed of graphene, wherein, the graphene composing the source electrode, the drain electrode and the gate electrode is formed by reducing oxidized graphene, the doped oxidized graphene or doped graphene composing the active region is formed by treating oxidized graphene.

Preferably, the step of forming a gate electrode composed of graphene includes: forming a first oxidized graphene material layer; reducing the first oxidized graphene material layer to obtain a first graphene material layer, patterning the first graphene material layer to form the gate electrode; or patterning the first oxidized graphene material layer, and reducing the patterned first oxidized graphene material layer, to form the gate electrode.

Preferably, the step of forming a gate insulating layer composed of oxidized graphene includes: forming a second oxidized graphene material layer, and taking the second oxidized graphene material layer as the gate insulating layer.

Preferably, the step of forming an active region composed of doped oxidized graphene or doped graphene includes: forming a third oxidized graphene material layer; and doping the third oxidized graphene material layer, to obtain a doped oxidized graphene material layer, patterning the doped oxidized graphene material layer to form the active region; or patterning the third oxidized graphene material layer, and doping the patterned third oxidized graphene material layer, to form the active region; or, reducing the third oxidized graphene material layer, and then doping the same, to obtain the doped graphene material layer, patterning the doped graphene material layer, to form the active region; or patterning the third oxidized graphene material layer, reducing the patterned third oxidized graphene material layer, and then doping the same, to form the active region.

Preferably, the step of forming an active region composed of doped oxidized graphene or doped graphene includes: forming a third oxidized graphene material layer; forming a photoresist layer on the third oxidized graphene material layer, the photoresist layer including polymethyl methacrylate, heating to 50° C. to 100° C. so that polymethyl methacrylate penetrates into the third oxidized graphene material layer, and the third oxidized graphene material layer become a doped oxidized graphene material layer; or, reducing the third oxidized graphene material layer, to obtain a second graphene material layer, and then forming a photoresist layer on the second graphene material layer, the photoresist layer including polymethyl methacrylate, heating to 50° C. to 100° C. so that polymethyl methacrylate penetrates into the second graphene material layer, and the second graphene material layer become a doped graphene material layer, patterning the doped oxidized graphene material layer or the doped graphene material layer by a photolithography process, to form the active region.

Preferably, the step of forming a source electrode and a drain electrode composed of graphene includes: forming a fourth oxidized graphene material layer; reducing the fourth oxidized graphene material layer to obtain a third graphene material layer; patterning the third graphene material layer to form the source electrode and the drain electrode; or, patterning the fourth oxidized graphene material layer, and reducing the patterned fourth oxidized graphene material layer to form the source electrode and the drain electrode.

Preferably, the step of forming a gate insulating layer composed of oxidized graphene and the step of forming an active region composed of doped oxidized graphene or doped graphene include: forming a fifth oxidized graphene material layer; performing a treatment including doping and patterning to an upper layer portion of the fifth oxidized graphene material layer, to obtain the active region composed of doped oxidized graphene; or, performing a treatment including reducing, doping and patterning to an upper layer portion of the fifth oxidized graphene material layer, to obtain the active region composed of doped graphene; wherein, a portion of the fifth oxidized graphene material layer without being performed the treatment composes the gate insulating layer.

Preferably, the step of forming an active region composed of doped graphene and the step of forming a source electrode and a drain electrode composed of graphene include: forming a sixth oxidized graphene material layer; reducing the sixth oxidized graphene material layer to obtain a fourth graphene material layer; performing a treatment including patterning and doping to the fourth graphene material layer, to obtain the source electrode, the drain electrode and the active region, wherein, the patterning is performed so that the fourth graphene material layer is forms a pattern including the source electrode, the drain electrode and the active region, and the doping is performed so as to dope a portion corresponding to the active region.

A technical solution for achieving the above-described object is a thin film transistor, comprising: a source electrode, a drain electrode, a gate electrode, an active region and a gate insulating layer, wherein, the source electrode, the drain electrode and the gate electrode are composed of graphene, the active region is composed of doped oxidized graphene or doped graphene, the gate insulating layer is composed of oxidized graphene, and wherein, the graphene composing the source electrode, the drain electrode and the gate electrode is formed by reducing oxidized graphene, and the doped oxidized graphene or doped graphene composing the active region is formed by treating oxidized graphene.

Preferably, doped oxidized graphene composing the active region is formed by doping oxidized graphene, or, doped graphene composing the active region is formed by reducing oxidized graphene, and then doping the same.

Preferably, the source electrode and the drain electrode have a thickness in a range of 1 nm to 100 nm, and/or, the gate electrode has a thickness in a range of 1 nm to 100 nm, and/or, the active region has a thickness in a range of 1 nm to 100 nm, and/or, the gate insulating layer has a thickness in a range of 30 nm to 300 nm.

A technical solution for achieving the above-described object is an array substrate, comprising the thin film transistor as described above.

Preferably, the array substrate further comprises: a pixel electrode, disposed in a same layer as the source electrode and the drain electrode; and/or, a common electrode, disposed in a same layer as the gate electrode.

The overall structure of the thin film transistor according to the present disclosure is formed with oxidized graphene as a fundamental raw material, and thus, the raw material used in preparation is simple, so that the preparation is simple. The oxidized graphene is easy to form a thin film, so it is easy to be used in preparation of a conventional process. Further, the structure of the thin film transistor is composed entirely of graphene or oxidized graphene, wherein, the source electrode, the drain electrode and the gate electrode composed of graphene are low in electric resistance and good in electrical conductivity, and the gate insulating layer composed of oxidized graphene is good in insulating property, the active region composed of doped oxidized graphene or doped graphene has a high mobility and a high on/off ratio. Meanwhile, since materials of the respective structures are similar, lattice constants of the respective structures are matched and bonding surfaces will not generate lattice deformation. Contact resistance between the active region and the source electrode and the drain electrode is small, so that no ohmic contact layer is required. Therefore, the thin film transistor according to the present disclosure has an excellent overall performance.

Figure 1:
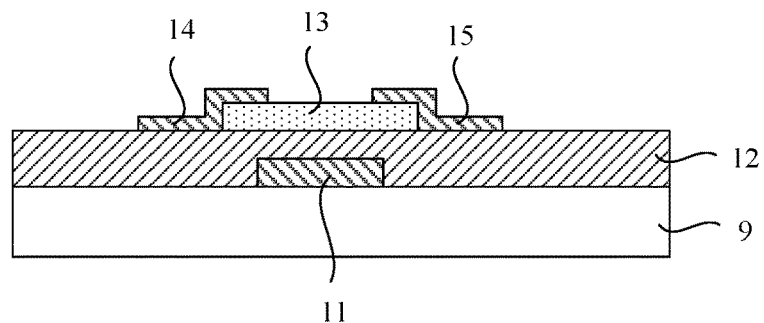
FIG. 1 is a sectional schematic structural diagram of a thin film transistor according to an embodiment of the present disclosure.

Reference signs: 11. gate electrode; 12. gate insulating layer; 13. active region; 14. source electrode; 15. drain electrode; 21. first oxidized graphene material layer; 25. fifth oxidized graphene material layer; 26. sixth oxidized graphene material layer; 31. first graphene material layer; 34. fourth graphene material layer; 41. doped graphene material layer; 9. substrate.

DETAILED DESCRIPTION

In order to make those skilled in the art better understand the technical solutions of the embodiments of the present disclosure, the present disclosure is further described in detail in conjunction with the drawings and specific implementation modes.

First Embodiment

With reference to FIG. 1 to FIG. 7, the embodiment provides a thin film transistor, comprising: a source electrode 14, a drain electrode 15, a gate electrode 11, an active region 13 and a gate insulating layer 12, wherein, the source electrode 14, the drain electrode 15 and the gate electrode 11 are composed of graphene, the active region 13 is composed of doped oxidized graphene or doped graphene, the gate insulating layer 12 is composed of oxidized graphene, and wherein, the graphene composing the source electrode 14, the drain electrode 15 and the gate electrode 11 is formed by reducing oxidized graphene, and the doped oxidized graphene or doped graphene composing the active region 13 is formed by treating oxidized graphene.

In particular, the doped oxidized graphene composing the active region 13 is formed by doping an oxidized graphene, or, the doped graphene composing the active region 13 is formed by reducing an oxidized graphene, and then doping the same.

That is, as shown in FIG. 1, in the thin film transistor according to the embodiment, all of the structures are composed of graphene or oxidized graphene material, and are formed with oxidized graphene as an initial raw material.

Graphene is discovered by Professor Andre-Heim from the University of Manchester in 2004, which is a lamellar material composed of carbon atoms, and has the carbon atoms arranged in a hexagonal structure similar to that of graphite in each layer thereof. Graphene has an excellent electrical conductivity, at a normal temperature, its electron mobility is more than 15000 $cm^2/V \cdot s$, its resistivity is on an order of $10^{-6}$ $\Omega/m$, and thus, when it is used as the source electrode 14, the drain electrode 15 and the gate electrode 11, etc., it can greatly reduce electrical resistance of these structures.

Oxidized graphene (GO) can be obtained by oxidizing graphene, which can be used as a raw material for preparing graphene by a reduction method. Oxidized graphene has a high resistivity, and thus, when it is used as the gate insulating layer 12, it can provide a good insulating effect.

Oxidized graphene or graphene, after being doped, will become a semiconductor material, which has a high mobility and a high switching current ratio, and thus is suitable as a material of the active region 13.

It can be seen that, the materials of respective structures in the thin film transistor according to the embodiment are very satisfactory, and, since materials of the respective structures are similar, lattice constants of the respective structures are matched, and lattice deformation may not generated in bonding surfaces, contact resistance between the active region 13 and the source electrode 14 and the drain electrode 15 is small, so that no ohmic contact layer is required. Therefore, the thin film transistor according to the present disclosure has an excellent overall performance.

In addition, the graphene/oxidized graphene material is bendable, so it is applicable to a flexible display device.

Of course, it should be understood that, the form of the thin film transistor as shown in FIG. 1 is not intended to limit the protection scope of the present disclosure, as long as the above material is used, the thin film transistor according to the embodiment may also have different structures. For example, the thin film transistor may be of a top gate type; and for another example, the source electrode 14 and the drain electrode 15 may also be located under the active region 13; and for another example, the active region 13 may not be in direct contact with the source electrode 14 and the drain electrode 15, instead, a passivation layer (which may be composed of oxidized graphene) may further be provided between the active region 13 and the source electrode 14, the drain electrode 15, the source electrode 14 and the drain electrode 15 are connected with the active region 13 through via holes in the passivation layer.

Preferably, in the thin film transistor according to the embodiment, the source electrode 14 and the drain electrode 15 have a thickness in a range of 1 nm to 100 nm, the gate electrode 11 has a thickness in a range of 1 nm to 100 nm, the active region 13 has a thickness in a range of 1 nm to 100 nm, and the gate insulating layer 12 has a thickness in a range of 30 nm to 300 nm.

When the graphene/oxidized graphene material is used, the thicknesses of respective structures of the thin film transistor are preferably in the above-described range, this is because that graphene has a good electrical conductivity, and doped oxidized graphene or doped graphene also has a good electrical conductivity, and thereby, the thicknesses of the structures of the gate electrode 11, the source electrode 14, the drain electrode 15, and the active region 13, etc. may be very small, and even be close to a thickness (1 nm) of a single layer graphene, and such a thin structure is flexible and bendable, and is applicable to the flexible display device. The thickness of the gate insulating layer 12 is relative large to insure an insulating effect.

The embodiment further provides a producing method of a thin film transistor, comprising steps of: forming a gate electrode composed of graphene; forming a gate insulating layer composed of oxidized graphene; forming an active region composed of doped oxidized graphene or doped graphene; and forming a source electrode and a drain electrode composed of graphene.

That is, the embodiment provides a method for preparing the thin film transistor as described above, wherein, corresponding materials are used for forming respective structures of the thin film transistor.

It should be understood that, when specific structures of the thin film transistor are different, orders of forming the respective structures are also different, and thus, the respective steps as described above only indicate that the producing method of the thin film transistor needs to comprise corresponding steps, but do not represent that the respective steps in the producing method must be performed in the order as described above. For example, when a thin film transistor of a bottom gate type is prepared, it is necessary to firstly form the gate electrode, then to form the gate insulating layer, and finally to form the active region; conversely, when a thin film transistor of a top gate type is prepared, it is necessary to firstly form the active region, then to form the gate insulating layer, and finally to form the gate electrode.

Hereinafter, an exemplary producing method of a thin film transistor is provided, its specific preparation steps are merely exemplary and not limitative to the present disclosure, and those skilled in the art can also change the order of the respective steps as required, to prepare thin film transistors of other structures.

In particular, with reference to FIG. 1 to FIG. 7, the exemplary producing method of the thin film transistor is described in details, and the exemplary producing method of the thin film transistor comprises steps S1 to S4.

S1: forming a gate electrode 11 composed of graphene, in particular, includes sub-steps S101 to S102.

S101: forming a first oxidized graphene material layer 21.

Figure 3:
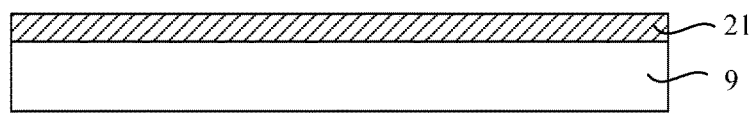
FIG. 3 is a sectional schematic structural diagram of the thin film transistor after a first oxidized graphene material layer is formed therein according to the embodiment of the present disclosure.

For example, an oxidized graphene material may be dispersed in a solvent to form a suspension, then the suspension is coated on a substrate 9, and finally, the solvent is heated and evaporated to dryness, so as to form the complete first oxidized graphene material layer 21 on the substrate 9, as shown in FIG. 3. In the example, a specific coating amount of the suspension is determined by taking a standard that a thickness of the first oxidized graphene material layer 21 to be formed is within the range of thickness of the above gate electrode 11. Ethanol with a strong volatility may be selected as the solvent, and a concentration of the oxidized graphene material is determined by taking a criterion for facilitates coating and film forming.

In the example, the oxidized graphene material layer is formed firstly, instead of the graphene material is formed directly, because oxidized graphene is more easily dispersed and film-formed than graphene, and, according to the method of the embodiment, the raw materials of all the structures are oxidized graphene, so that the processes are unified, and the raw materials are easy to manage.

Figure 2:
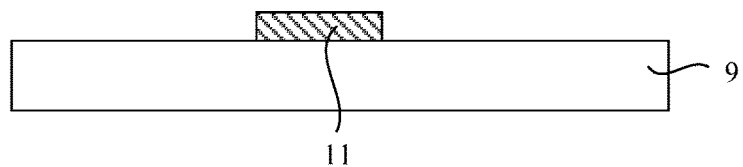
FIG. 2 is a sectional schematic structural diagram of the thin film transistor after a gate electrode is formed therein according to the embodiment of the present disclosure.

S102: reducing the first oxidized graphene material layer 21 to obtain a first graphene material layer 31, patterning the first graphene material layer 31 to form the gate electrode 11, to obtain a structure as shown in FIG. 2.

Figure 4:
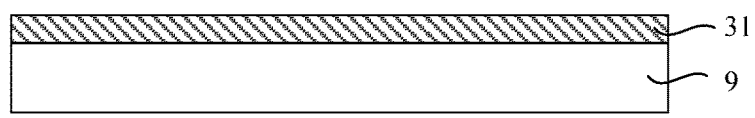
FIG. 4 is a sectional schematic structural diagram of the thin film transistor after a first graphene material layer is formed therein according to the embodiment of the present disclosure.

That is, after the first oxidized graphene material layer 21 is obtained, the entire first oxidized graphene material layer 21 is reduced firstly, so that it is transformed into the first graphene material layer 31 (as shown in FIG. 4), and then an unnecessary portion of the first graphene material layer 31 is removed (i.e., patterning the first graphene material layer 31), so that a remaining portion of the first graphene material layer 31 forms the gate electrode 11 composed of graphene as shown in FIG. 2.

A known method may be used for the above reducing the first oxidized graphene material layer 21, which may be any of the method as follows: a. reducing the first oxidized graphene material layer 21 by using a reducing gas, for example, the first oxidized graphene material layer 21 may be reduced by using hydrogen (at a processing temperature within a range of 100° C. to 200° C.), or hydrogen bromide or hydrogen iodide gas (at a processing temperature within a range of 25° C. to 100° C.), or hydrazine ($N_2H_4$) steam (at a processing temperature within a range of 25° C. to 100° C.); b. performing vacuum thermal reduction on the first oxidized graphene material layer 21, i.e., in a vacuum atmosphere, the first oxidized graphene material layer 21 is heated at a temperature of 100° C. to 300° C. for 1 second to 10 seconds, to reduce the same; and c. performing plasma treatment on the first oxidized graphene material layer 21, i.e., the first oxidized graphene material layer 21 is treated by plasmas of hydrogen, argon, etc., to reduce the same.

The above "patterning" specifically may be completed by a patterning process, i.e., coating a layer of photoresist on the first graphene material layer 31 firstly, then exposing and developing the photoresist, and removing a part of the photoresist, so that the unnecessary part of the first graphene material layer 31 is exposed, then removing the exposed part of the first graphene material layer 31 by a dry etching process, and finally stripping the remaining photoresist, so that the remaining part of the first graphene material layer 31 becomes a desired structure (i.e., the gate electrode 11).

An etching gas used in the dry etching method may be oxygen, a gas pressure may be 10 mTorr to 300 mTorr, an etching power is 100 W to 4000 W, and an etching time is determined by taking a criterion that it not only can completely remove the target layer, but also does not affect a structure below it.

Since the above processes of reducing, dry etching and the like per se are known, they will not be described in detail herein.

As another mode of the embodiment, step S102 may be: patterning the first oxidized graphene material layer 21, and reducing the patterned first oxidized graphene material layer 21, to form the gate electrode 11.

Figure 5:
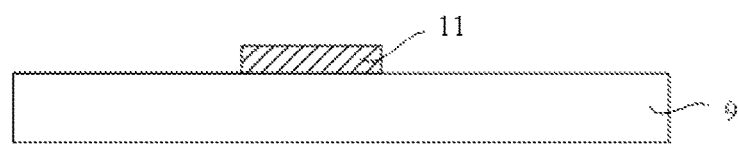
FIG. 5 is a sectional schematic structural diagram of the thin film transistor after the first oxidized graphene material layer is patterned therein according to the embodiment of the present disclosure.

That is, after the first oxidized graphene material layer 21 is formed, as shown in FIG. 5, the first oxidized graphene material layer 21 may also be patterned directly, so that the remaining first oxidized graphene material layer 21 becomes a pattern corresponding to the gate electrode 11, and then the remaining part of the first oxidized graphene material layer 21 is reduced, so as to form the gate electrode 11 composed of graphene as shown in FIG. 2.

Specific processes such as reducing, dry etching, etc. may be the same as those previously described with respect to the mode of firstly reducing and then patterning, and thus will not be described in detail herein.

It can be seen that, there are two modes of forming the gate electrode 11, i.e., firstly patterning and then reducing, and firstly reducing and then patterning; similarly, henceforth modes of forming the source electrode 14 and the drain electrode 15 may also be firstly patterning and then reducing, or firstly reducing and then patterning; and a mode of forming the active region 13 may be firstly patterning and then doping, or firstly doping and then patterning.

In step S102, below the first oxidized graphene material layer 21 directly is the substrate 9, without other structures. Thus, firstly patterning the first oxidized graphene material layer 21 is the same as later patterning it. However, in a subsequent step, if the patterning is performed firstly, a structure (e.g., the gate insulating layer 12) below the patterned layer (e.g., a layer for forming the active region 13) is exposed, and thus, a subsequent process (e.g., doping) may affect the exposed structure below; therefore, it is further necessary to protect the exposed structure below with temporary photoresist. Therefore, for the subsequent process, a mode of firstly doping (or firstly reducing) and then patterning should be selected preferably.

Figure 6:
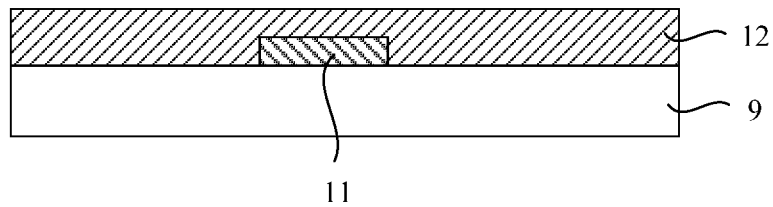
FIG. 6 is a sectional schematic structural diagram of the thin film transistor after a gate insulating layer is formed therein according to the embodiment of the present disclosure.

S2: forming a gate insulating layer 12 composed of oxidized graphene, which preferably includes: forming a second oxidized graphene material layer, and taking the second oxidized graphene material layer as the gate insulating layer 12, to obtain a structure as shown in FIG. 6.

That is, since the gate insulating layer 12 is generally complete, the second graphene material layer may be formed by using the method as described above, and is directly used as the gate insulating layer 12.

Of course, if the gate insulating layer 12 has a structure such as a via hole therein, this step may also include a process of patterning the second oxidized graphene material layer to form the via hole.

S3: forming an active region 13 composed of doped oxidized graphene or doped graphene; which preferably includes sub-steps S301 to S302.

S301: forming a third oxidized graphene material layer.

That is, a complete third oxidized graphene material layer is formed according to the method as described above.

Figure 7:
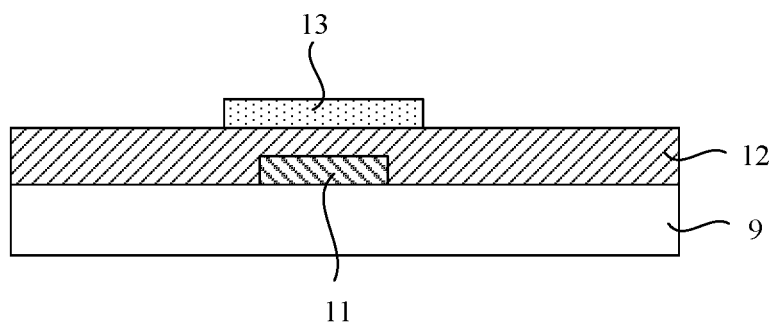
FIG. 7 is a sectional schematic structural diagram of the thin film transistor after an active region is formed therein according to the embodiment of the present disclosure.

S302: doping the third oxidized graphene material layer, to obtain a doped oxidized graphene material layer, and patterning the doped oxidized graphene material layer to form the active region 13, to obtain a structure as shown in FIG. 7.

That is, the third oxidized graphene material layer is subjected to a doping treatment, so that it is transformed into a semiconductor material layer of a P-type or an N-type, that is, becomes the material layer available for the active region 13, and then it is subjected to a patterning process, to form the active region 13.

In the example, a doping material that enables the third oxidized graphene material layer to be transformed into the semiconductor material layer of the P-type includes a fluorine-containing polymer, water, nitrogen, nitrogen dioxide, oxygen, boron, chlorine, etc., and a doping material that enables the third oxidized graphene material layer to be transformed into the semiconductor material layer of the N-type includes nitrogen, phosphorus, ammonia, hydrogen, etc. Since the process of enabling one material to become a semiconductor material by doping is known, it will not be described in detail here.

Sub-step S302 may also be a step of: patterning the third oxidized graphene material layer, and doping the patterned third oxidized graphene material layer, to form the active region 13.

That is, as described above, firstly patterning and then doping may also be performed in sub-step S302.

Alternatively, sub-step S302 may also be a step of: reducing the third oxidized graphene material layer, and then doping the same, to obtain the doped graphene material layer, patterning the doped graphene material layer, to form the active region 13, That is, as another mode of the embodiment, when the active region 13 composed of doped graphene is to be prepared, the third oxidized graphene material layer may be firstly reduced to a graphene material layer, and then it is doped and patterned to obtain the active region 13.

An advantage of this mode rests with that, oxidized graphene contains a large amount of oxygen, it is difficult to directly perform a doping process on the same, and thus, preferably, it is firstly reduced to graphene, then doped, and finally patterned. Of course, at this time, specific processes such as reducing, doping and patterning may be the same as those previously described, and therefore will not be described in detail herein.

Of course, sub-step S302 may also be a step of: patterning the third oxidized graphene material layer, and reducing the patterned third oxidized graphene material layer, and then doping the same, to form the active region 13.

That is, when the reduction process is included, it is also possible to perform patterning firstly, and then reducing and doping.

As another mode of the embodiment, step S3 may further include sub-step S301' to sub-step S303'.

S301': forming the third oxidized graphene material layer.

S302': forming a photoresist layer on the third oxidized graphene material layer, the photoresist layer including polymethyl methacrylate, heating the photoresist layer to 50° C. to 100° C. so that polymethyl methacrylate penetrates into the third oxidized graphene material layer, to transform the third oxidized graphene material layer into a doped oxidized graphene material layer.

S303': patterning the doped oxidized graphene material layer by a photolithography process, to form the active region 13.

That is, as another mode of the embodiment, instead of using a single doping process, photoresist containing polymethyl methacrylate (PMMA) may be used in the patterning process, the photoresist layer is in contact with the third oxidized graphene material layer, when it is heated, polymethyl methacrylate therein may penetrates into the third oxidized graphene material layer, to thus transform the third oxidized graphene material layer into a semiconductor material (P-type) layer, so that doping and patterning are completed together, which simplifies the preparation process.

Of course, when the active region 13 composed of doped graphene is to be formed, the above step S302' may further be a step of: reducing the third oxidized graphene material layer, to obtain a second graphene material layer, and then forming a photoresist layer thereon, the photoresist layer including polymethyl methacrylate, heating to 50° C. to 100° C. so that polymethyl methacrylate penetrates into the second graphene material layer, to transform the same into a doped graphene material layer; and step S303' may be: patterning the doped graphene material layer by a photolithography process, to form the active region 13.

That is, the third oxidized graphene material layer may also be reduced to the graphene material layer, and then it is doped by using photoresist, so as to prepare the active region 13 composed of doped graphene.

S4: forming a source electrode 14 and a drain electrode 15 composed of graphene, which preferably include sub-steps S401 to S402.

S401: forming a fourth oxidized graphene material layer.

That is, according to the aforementioned method, the complete fourth graphene material layer is formed.

S402: reducing the fourth oxidized graphene material layer to obtain a third graphene material layer; patterning the third graphene material layer to form the source electrode 14 and the drain electrode 15, to obtain the thin film transistor as shown in FIG. 1.

That is, the fourth oxidized graphene material layer is firstly reduced to the third graphene material layer, and then patterned to form the source electrode 14 and the drain electrode 15.

Alternatively, sub-step S402 may also be a step of: patterning the fourth oxidized graphene material layer, reducing the patterned fourth oxidized graphene material layer to form the source electrode 14 and the drain electrode 15.

That is, as described above, in sub-step S402, patterning may be performed firstly and then, reducing; however, such a mode is cumbersome and thus is not preferable.

Second Embodiment

Figure 8:
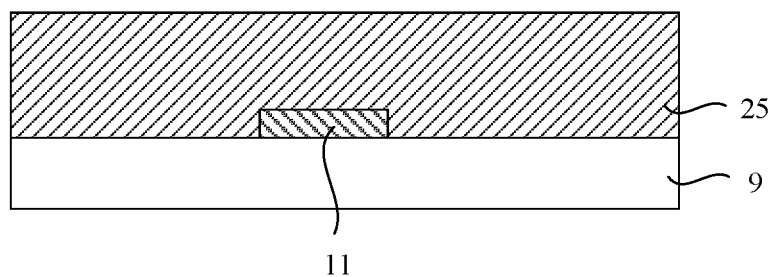
FIG. 8 is a sectional schematic structural diagram of the thin film transistor after a fifth oxidized graphene material layer is formed therein according to the embodiment of the present disclosure.
Figure 9:
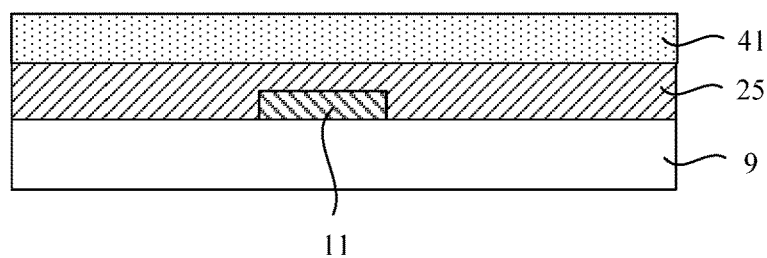
FIG. 9 is a sectional schematic structural diagram of the thin film transistor after an upper layer of the fifth oxidized graphene material layer is reduced therein according to the embodiment of the present disclosure.

With reference to FIG. 8 and FIG. 9, the embodiment provides a producing method of the above-described thin film transistor, which is similar to the producing method according to the first embodiment as described above, but differs in that, the gate insulating layer 12 and the active region 13 are formed together.

In particular, in the embodiment, forming the gate insulating layer 12 composed of oxidized graphene and forming the active region 13 composed of doped oxidized graphene or doped graphene are implemented by steps 1 to 3 as follows.

Step 1: forming a fifth oxidized graphene material layer 25, as shown in FIG. 8.

A thickness of the fifth oxidized graphene material layer 25 should be equal to a sum of a thickness of the gate insulating layer 12 and a thickness of the active region 13.

Step 2: performing a treatment including doping and patterning to an upper layer portion of the fifth oxidized graphene material layer 25, to obtain the active region 13 composed of doped oxidized graphene; or, performing a treatment including reducing, doping and patterning to an upper layer portion of the fifth oxidized graphene material layer 25, to obtain the active region 13 composed of doped graphene.

Therein, the "upper layer" refers to an upside portion of the fifth oxidized graphene material layer 25, and its thickness should be equal to the thickness of the active region 13.

That is, in step 2, only the upper layer portion of the fifth oxidized graphene material layer 25 is treated and adopted to form the active region 13, while a lower layer portion of the fifth oxidized graphene material layer 25 remains as the oxidized graphene material layer.

In particular, as a mode of the embodiment, the upper layer portion of the fifth oxidized graphene material layer 25 may be successively reduced and doped, so as to be transformed into a doped graphene material layer 41, and obtain the structure as shown in FIG. 9; and then, the doped graphene material layer 41 is patterned, so as to form the active region 13, and obtain the structure as shown in FIG. 7. In this process, it is possible to control parameters so that the above processes can only affect the upper layer portion of the fifth oxidized graphene material layer 25.

Of course, specific modes of forming the active region 13 by using the upper layer portion of the fifth oxidized graphene material layer 25 are various. Reference can be made to the description in the first embodiment. For example, it may be patterning firstly and then reducing and doping; for another example, the active region 13 may be composed of doped oxidized graphene; and for still another example, doping either may be implemented by ion implantation, or may be implemented by patterning and at the same time by penetration of photoresist, or other means, and thus, a specific process for forming the active region 13 as described above will not be specifically limited herein.

Step 3: a portion of the fifth oxidized graphene material layer 25 without being performed the treatment composes the gate insulating layer 12.

When the above-described active region 13 is formed, the remaining portion of the fifth oxidized graphene material layer 25 without being such treated is thus equivalent to the gate insulating layer 12, i.e., it composes the gate insulating layer 12.

Since methods for preparing other structures of the thin film transistor in the embodiment are similar to those according to the first embodiment, they will not be described in detail herein.

Third Embodiment

With reference to FIG. 10 to FIG. 13, the embodiment provides a producing method of a thin film transistor, which is similar to the producing method according to the first embodiment as described above, but differs in that, the source electrode 14, the drain electrode 15, and the active region 13 are formed together.

In particular, forming the source electrode 14 and the drain electrode 15 composed of graphene, and forming the active region 13 composed of doped oxidized graphene or doped graphene are implemented by steps a to c as follows.

Figure 10:
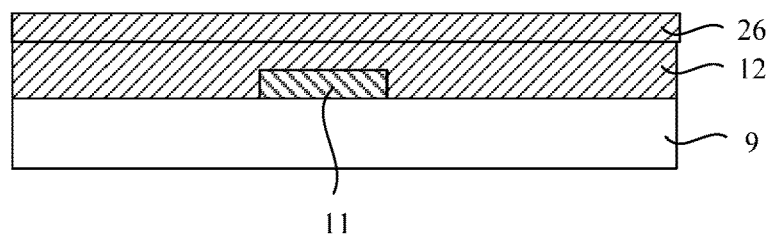
FIG. 10 is a sectional schematic structural diagram of the thin film transistor after a sixth oxidized graphene material layer is formed therein according to the embodiment of the present disclosure.

Step a: forming a sixth oxidized graphene material layer 26, as shown in FIG. 10.

A thickness of the sixth oxidized graphene material layer 26 should be equal to a sum of a thickness of the source electrode 14, a thickness of the drain electrode 15 and a thickness of the active region 13

Figure 11:
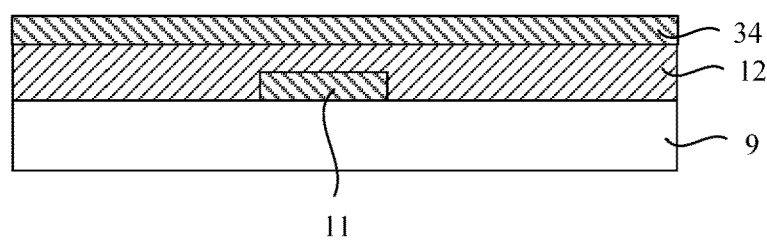
FIG. 11 is a sectional schematic structural diagram of the thin film transistor after a fourth graphene material layer is formed therein according to the embodiment of the present disclosure.

Step 2: reducing the sixth oxidized graphene material layer 26 to obtain the fourth graphene material layer 34, as shown in FIG. 11.

That is, the sixth oxidized graphene material layer 26 is entirely reduced to form the fourth graphene material layer 34.

Step 3: performing a treatment including patterning and doping to the fourth graphene material layer 34, to obtain the source electrode 14, the drain electrode 15 and the active region 13, wherein, the patterning is performed so that the fourth graphene material layer 34 forms a pattern including the source electrode 14, the drain electrode 15 and the active region 13, and doping is performed so as to dope a portion corresponding to the active region 13.

Figure 12:
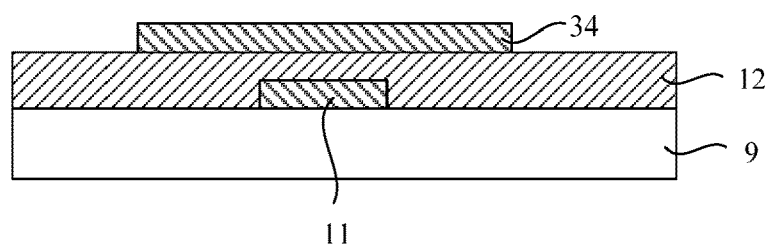
FIG. 12 is a sectional schematic structural diagram of the thin film transistor after the fourth graphene material layer is patterned therein according to the embodiment of the present disclosure.
Figure 13:
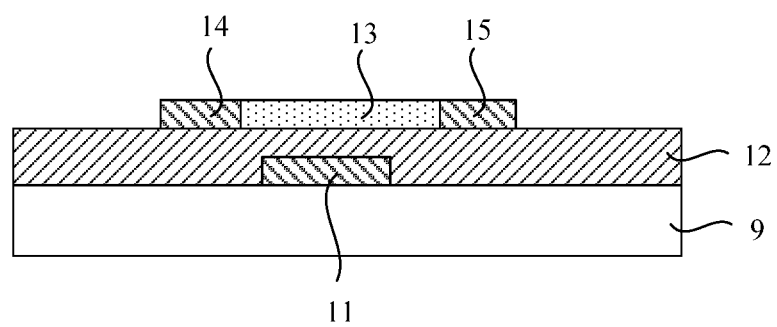
FIG. 13 is a sectional schematic structural diagram of the thin film transistor after a source electrode, a drain electrode and the active region are formed therein according to the embodiment of the present disclosure.

That is, portions of the fourth graphene material layer 34 other than the source electrode 14, the drain electrode 15, and the active region 13 can be removed to obtain a structure as shown in FIG. 12, and then, a portion of the graphene material layer corresponding to the active region 13 is doped so that it is transformed into the doped graphene material layer (i.e., the active region 13), and the remaining portion of the graphene material layer just becomes the source electrode 14 and the drain electrode 15, thus obtaining a structure as shown in FIG. 13.

Of course, it should be understood that, the above order of performing doping and patterning may also be varied, that is, firstly, doping the portion of the fourth graphene material layer 34 corresponding to the active region 13, and then performing patterning on the same.

Of course, it should be understood that, although a case where the source electrode 14, the drain electrode 15 and the active region 13 are provided on a same layer is described herein as an example, the source electrode 14, the drain electrode 15 may be located at least partially above the active layer 13 (i.e., the structure shown in FIG. 1), or, the source electrode 14 and the drain electrode 15 may be located at least partially below the active layer 13, which, for example, may be implemented by treating a partial thickness range of an entire layer, and will not be described in detail herein.

Since methods for preparing other structures of the thin film transistor in the embodiment are similar to those according to the first embodiment, they will not be described in detail herein.

Fourth Embodiment

The embodiment further provides an array substrate, comprising the thin film transistor as described above.

Of course, according to different types of the array substrate, a structure, the number, connection relationship, etc. of the thin film transistor therein are also different, which will not be described in detail herein.

At the same time, the array substrate may further comprise wires such as a gate line and a data line, and these wires obviously may be composed of graphene as well as the gate electrode, the source electrode, the drain electrode, and the like.

Preferably, the array substrate further comprises: a pixel electrode disposed in a same layer as the source electrode and the drain electrode; and/or, a common electrode disposed in a same layer as the gate electrode.

That is, if the array substrate is an array substrate used in a liquid crystal display device, it further comprises the pixel electrode, the common electrode, and so on, and these electrodes are preferably provided in the same layer as the source electrode, the drain electrode and the gate electrode, that is, these electrodes, as well as the source electrode, the drain electrode and the gate electrode may be made of a same material layer, and formed synchronously in a same process, and thus, they necessarily have a same composition.

In the array substrate, the pixel electrode and the common electrode are generally required to be conductive and transparent; however, in the prior art, since the source electrode, the drain electrode, the gate electrode and the like are made of an opaque metal material, indium tin oxide (ITO), etc., are needed to prepare the pixel electrode and the common electrode separately. As described above, because the graphene material has a good electrical conductivity, the graphene material layer may be made to have a very small thickness. In this case, the graphene material layer is transparent, and thus, graphene can be directly used for composing the pixel electrode, the common electrode, and the like. In this way, the pixel electrode and the common electrode not only have good conductivity, but also can be provided in the same layer as the source electrode, the drain electrode or the gate electrode (i.e., formed synchronously), which can simplify the preparation process of the array substrate.

The embodiment further provides a display device, comprising the above-described array substrate.

In particular, the display device can be: a liquid crystal panel, electronic paper, an OLED panel, a cellphone, a tablet computer, a television, a display, a laptop, a digital photo frame, a navigator and any product or part with a display function.

It should be understood that the foregoing embodiments are only exemplary embodiments of the present disclosure to describe the principle of the present disclosure; however, the present disclosure is not limited thereto. Those ordinarily skilled in the art can make various changes and modifications without departing from the spirit and essence of the present disclosure, and such changes and modifications also fall into the protection scope of the present disclosure.

The invention claimed is:

1. A thin film transistor, comprising: a source electrode, a drain electrode, a gate electrode; an active region and a gate insulating layer, wherein, the source electrode, the drain electrode and the gate electrode are composed of graphene, the active region is composed of doped oxidized graphene, the gate insulating layer is composed of oxidized graphene, and wherein, the graphene composing the source electrode, the drain electrode and the gate electrode is formed by reducing oxidized graphene, and the doped oxidized graphene composing the active region is formed by treating oxidized graphene.

2. The thin film transistor according to claim 1, wherein, doped oxidized graphene composing the active region is formed by doping oxidized graphene.

3. The thin film transistor according to claim 1, wherein, doped graphene composing the active region is formed by reducing oxidized graphene, and then doping the same.

4. The thin film transistor according to claim 1, wherein, the source electrode and the drain electrode have a thickness in a range of 1 nm to 100 nm, and/or, the gate electrode has a thickness in a range of 1 nm to 100 nm, and/or, the active region has a thickness in a range of 1 nm to 100 nm, and/or, the gate insulating layer has a thickness in a range of 30 nm to 300 nm.

5. An array substrate, comprising:
the thin film transistor according to claim 1.

6. The array substrate according to claim 5, further comprising:
a pixel electrode, disposed in a same layer as the source electrode and the drain electrode; and/or
a common electrode, disposed in a same layer as the gate electrode.

7. A producing method of a thin film transistor, comprising steps of:
forming a gate electrode composed of graphene;
forming a gate insulating layer composed of oxidized graphene;
forming an active region composed of doped oxidized graphene or doped graphene;
forming a source electrode and a drain electrode composed of graphene,
wherein, the graphene composing the source electrode, the drain electrode and the gate electrode is formed by reducing oxidized graphene, and
the doped oxidized graphene composing the active region is formed by a first treating of oxidized graphene, or the doped graphene composing the active region is formed by a second treating of oxidized graphene,
wherein, the first treating of oxidized graphene is different from the second treating of oxidized graphene.

8. The producing method of the thin film transistor according to claim 7, wherein, the step of forming a gate electrode composed of graphene includes:
forming a first oxidized graphene material layer;
reducing the first oxidized graphene material layer to obtain a first graphene material layer, patterning the first graphene material layer to form the gate electrode; or patterning the first oxidized graphene material layer, and reducing the patterned first oxidized graphene material layer, to form the gate electrode.

9. The producing method of the thin film transistor according to claim 7, wherein, the step of forming a gate insulating layer composed of oxidized graphene includes:
forming a second oxidized graphene material layer, and taking the second oxidized graphene material layer as the gate insulating layer.

10. The producing method of the thin film transistor according to claim 7, wherein, the step of forming an active region composed of doped oxidized graphene includes:
forming a third oxidized graphene material layer;
doping the third oxidized graphene material layer, to obtain a doped oxidized graphene material layer, patterning the doped oxidized graphene material layer to form the active region; or patterning the third oxidized graphene material layer, and doping the patterned third oxidized graphene material layer, to form the active region.

11. The producing method of the thin film transistor according to claim 7, wherein, the step of forming an active region composed of doped graphene includes:
forming a third oxidized graphene material layer;
reducing the third oxidized graphene material layer, and then doping the same, to obtain the doped graphene material layer, patterning the doped graphene material layer, to form the active region; or patterning the third oxidized graphene material layer, reducing the patterned third oxidized graphene material layer, and then doping the same, to form the active region.

12. The producing method of the thin film transistor according to claim 7, wherein, the step of forming an active region composed of doped oxidized graphene includes:
forming a third oxidized graphene material layer;
forming a photoresist layer on the third oxidized graphene material layer, the photoresist layer including polymethyl methacrylate, heating to 50° C. to 100° C. so that polymethyl methacrylate penetrates into the third oxidized graphene material layer, and the third oxidized graphene material layer become a doped oxidized graphene material layer;
patterning the doped oxidized graphene material layer by a photolithography process, to form the active region.

13. The producing method of the thin film transistor according to claim 7, wherein, the step of forming an active region composed of doped graphene includes:
forming a third oxidized graphene material layer;
reducing the third oxidized graphene material layer, to obtain a second graphene material layer, and then forming a photoresist layer on the second graphene material layer, the photoresist layer including polymethyl methacrylate, heating to 50° C. to 100° C. so that polymethyl methacrylate penetrates into the second graphene material layer, and the second graphene material layer become a doped graphene material layer;
patterning the doped graphene material layer by a photolithography process, to form the active region.

14. The producing method of the thin film transistor according to claim 7, wherein, the step of forming a source electrode and a drain electrode composed of graphene includes:
forming a fourth oxidized graphene material layer;
reducing the fourth oxidized graphene material layer to obtain a third graphene material layer; patterning the third graphene material layer to form the source electrode and the drain electrode; or, patterning the fourth oxidized graphene material layer, and reducing the patterned fourth oxidized graphene material layer to form the source electrode and the drain electrode.

15. The producing method of the thin film transistor according to claim 7, wherein, the step of forming a gate insulating layer composed of oxidized graphene and the step of forming an active region composed of doped oxidized graphene include:

forming a fifth oxidized graphene material layer;

performing a treatment including doping and patterning to an upper layer portion of the fifth oxidized graphene material layer, to obtain the active region composed of doped oxidized graphene;

a portion of the fifth oxidized graphene material layer without being performed the treatment composes the gate insulating layer.

16. The producing method of the thin film transistor according to claim 7, wherein, the step of forming a gate insulating layer composed of oxidized graphene and the step of forming an active region composed of doped graphene include:

forming a fifth oxidized graphene material layer;

performing a treatment including reducing, doping and patterning to an upper layer portion of the fifth oxidized graphene material layer, to obtain the active region composed of doped graphene;

a portion of the fifth oxidized graphene material layer without being performed the treatment composes the gate insulating layer.

17. The producing method of the thin film transistor according to claim 7, wherein, the step of forming an active region composed of doped graphene and the step of forming a source electrode and a drain electrode composed of graphene include:

forming a sixth oxidized graphene material layer;

reducing the sixth oxidized graphene material layer to obtain a fourth graphene material layer;

performing a treatment including patterning and doping to the fourth graphene material layer, to obtain the source electrode, the drain electrode and the active region, wherein, the patterning is performed so that the fourth graphene material layer forms a pattern including the source electrode, the drain electrode and the active region, and doping is performed so as to dope a portion corresponding to the active region.

* * * * *